United States Patent
Murayama et al.

(10) Patent No.: US 12,293,925 B2
(45) Date of Patent: May 6, 2025

(54) SEMICONDUCTOR DEVICE AND METHOD OF MANUFACTURING THE SAME

(71) Applicant: RENESAS ELECTRONICS CORPORATION, Tokyo (JP)

(72) Inventors: Yuki Murayama, Tokyo (JP); Makoto Koshimizu, Tokyo (JP); Takahiro Mori, Tokyo (JP); Junjiro Sakai, Tokyo (JP); Satoshi Iida, Tokyo (JP)

(73) Assignee: RENESAS ELECTRONICS CORPORATION, Tokyo (JP)

( * ) Notice: Subject to any disclaimer, the term of this patent is extended or adjusted under 35 U.S.C. 154(b) by 153 days.

(21) Appl. No.: 17/894,579

(22) Filed: Aug. 24, 2022

(65) Prior Publication Data
US 2023/0069864 A1 Mar. 9, 2023

(30) Foreign Application Priority Data
Sep. 6, 2021 (JP) ................ 2021-144539

(51) Int. Cl.
| | |
|---|---|
| H01L 21/4757 | (2006.01) |
| H01L 21/311 | (2006.01) |
| H01L 21/475 | (2006.01) |
| H01L 21/4763 | (2006.01) |
| H01L 21/768 | (2006.01) |
| H01L 23/00 | (2006.01) |
| H01L 23/31 | (2006.01) |

(Continued)

(52) U.S. Cl.
CPC .. *H01L 21/47573* (2013.01); *H01L 21/31144* (2013.01); *H01L 21/475* (2013.01); *H01L 21/47635* (2013.01); *H01L 23/3171* (2013.01); *H01L 23/522* (2013.01); *H01L 23/5329* (2013.01); *H01L 23/53295* (2013.01); *H01L 24/05* (2013.01); *H01L 21/76837* (2013.01)

(58) Field of Classification Search
CPC ... H01L 21/475; H01L 21/4757–47573; H01L 21/31144; H01L 21/47635; H01L 21/3171; H01L 21/7681–76837; H01L 23/522–53295; H01L 2224/46; H01L 2224/49–49505; H01L 24/05
See application file for complete search history.

(56) References Cited

U.S. PATENT DOCUMENTS

| | | | | |
|---|---|---|---|---|
| 5,903,167 A | * | 5/1999 | Sanwo ........... | H03K 19/018592 326/86 |
| 7,932,578 B2 | | 4/2011 | Uchida | |

(Continued)

FOREIGN PATENT DOCUMENTS

JP 2016-167631 A 9/2016

*Primary Examiner* — Shaun M Campbell
*Assistant Examiner* — Aneta B Cieslewicz
(74) *Attorney, Agent, or Firm* — Rimon P.C.

(57) ABSTRACT

There is formed a semiconductor device including, as the uppermost-layer wiring of the multilayer wiring layer, a plurality of first wirings, a second wiring, a plurality of first dummy wirings, a second dummy wiring, and a passivation film covering these wirings. The passivation film is patterned by etching with a photoresist film used as a mask, the plurality of first wirings and the plurality of first dummy wirings close thereto are densely formed, and the second dummy wiring is formed so as to surround a periphery of the second wiring sparsely formed directly above an analog circuit portion.

14 Claims, 10 Drawing Sheets

(51) Int. Cl.
*H01L 23/522* (2006.01)
*H01L 23/532* (2006.01)

(56) References Cited

U.S. PATENT DOCUMENTS

2011/0091819 A1* 4/2011 Hagiwara ........... G03F 7/70466
430/324
2016/0093570 A1* 3/2016 Watanabe ......... H01L 23/49541
257/531

* cited by examiner

SEMICONDUCTOR DEVICE AND METHOD OF MANUFACTURING THE SAME

CROSS-REFERENCE TO RELATED APPLICATIONS

The disclosure of Japanese Patent Application No. 2021-144539 filed on Sep. 6, 2021 including the specification, drawings and abstract is incorporated herein by reference in its entirety.

BACKGROUND

The present invention relates to a semiconductor device and a method of manufacturing the same and for example, relates to a technique which is effectively applied to a semiconductor device including a dummy wiring adjacent to a wiring of an uppermost layer of a multilayer wiring and a method of manufacturing the same.

There has been known a technique of using a passivation film as a film for covering and protecting a wiring of an uppermost layer of a multilayer wiring included in a semiconductor chip.

There are disclosed techniques listed below.
[Patent Document 1] Japanese Unexamined Patent Application Publication No. 2016-167631

Patent Document 1 discloses that a plurality of dummy metals are formed in a peripheral region of a high-frequency wiring of a semiconductor device.

SUMMARY

In recent years, a thickness of a passivation film has tended to be increased. Along with this increased thickness of the passivation film, a period of time taken for etching the passivation film by forming a resist pattern on the passivation film has become longer. There is a case in which a film thickness of the resist pattern is small in a region in which the uppermost-layer wiring is sparsely formed. In this case, an uppermost-layer insulating film constituting the passivation film may be etched by the etching process. As a result, reliability of the semiconductor device may be lowered.

Other problems and novel features will be apparent from the description of this specification and accompanying drawings.

An outline of the typical embodiment in this disclosure will be briefly described as follows.

A method of manufacturing a semiconductor device according to one embodiment is a method of forming a semiconductor device including, as an uppermost-layer wiring of a multilayer wiring layer, a plurality of first wirings, a second wiring, a plurality of first dummy wirings, and a second dummy wiring, and a passivation film covering these wirings. The passivation film is patterned by etching with a photoresist film used as a mask, the plurality of first wirings and the plurality of first dummy wirings close thereto are densely formed, and the second dummy wiring is formed so as to surround a periphery of the second wiring sparsely formed directly above an analog circuit portion.

According to one embodiment, it is possible to enhance reliability of a semiconductor device.

DETAILED DESCRIPTION

In the embodiments described below, the invention will be described in a plurality of sections or embodiments when required as a matter of convenience. However, these sections or embodiments are not irrelevant to each other unless otherwise stated, and the one relates to the entire or a part of the other as a modification example, details, or a supplementary explanation thereof. Also, in the embodiments described below, when referring to the number of elements (including number of pieces, values, amount, range, and the like), the number of the elements is not limited to a specific number unless otherwise stated or except the case where the number is apparently limited to a specific number in principle. The number larger or smaller than the specific number is also applicable.

Further, in the embodiments described below, it goes without saying that the components (including element steps) are not always indispensable unless otherwise stated or except the case where the components are apparently indispensable in principle. Similarly, in the embodiments described below, when the shape of the components, positional relation thereof, and the like are mentioned, the substantially approximate and similar shapes and the like are included therein unless otherwise stated or except the case where it is conceivable that they are apparently excluded in principle. The same goes for the numerical value and the range described above.

Hereinafter, embodiments of the present invention will be described in detail with reference to the accompanying drawings. Note that components having the same function are denoted by the same reference symbols throughout the drawings for describing the embodiments, and the repetitive description thereof is omitted. In addition, the description of the same or similar portions is not repeated in principle unless particularly required in the following embodiments.

A width referred to in the present application represents a length of an object (pattern) in a direction (a horizontal direction or a lateral direction) extending along a main surface of a semiconductor substrate. Also, a thickness referred to in the present application represents a length of an object in a vertical direction (a thickness direction or a height direction) with respect to the main surface of the semiconductor substrate.

Method of Manufacturing Semiconductor Device

In the following, with reference to FIG. 1 to FIG. 8, a method of manufacturing a semiconductor device according to the embodiment will be described.

Figure 1:
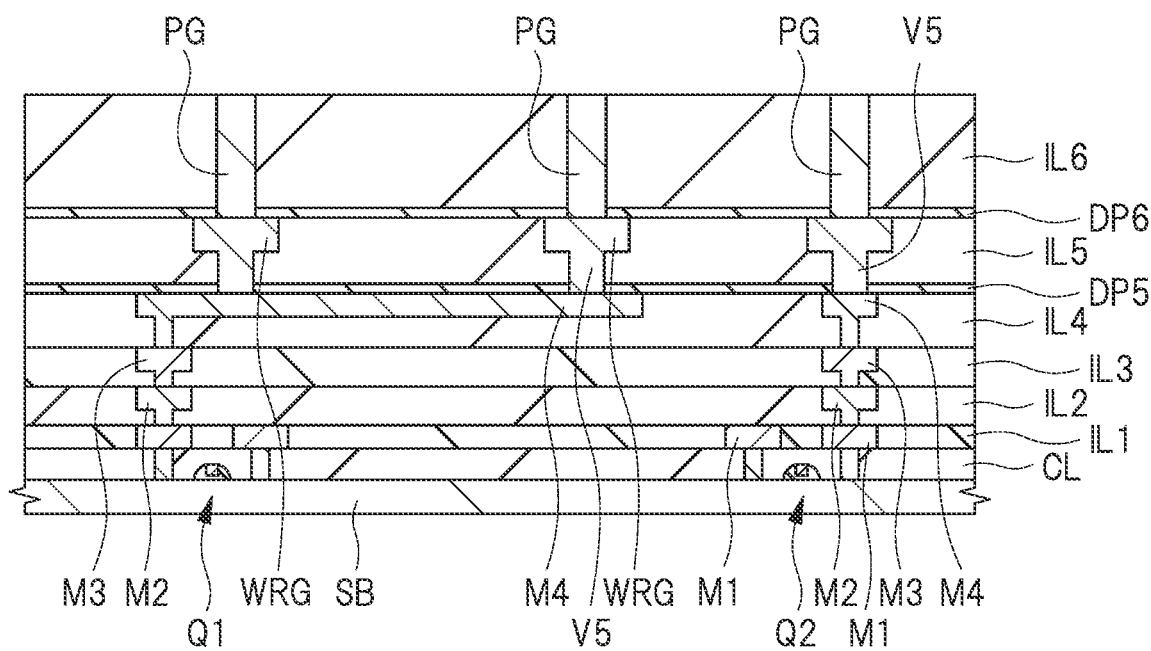
FIG. 1 is a cross-sectional view showing a method of manufacturing a semiconductor device according to an embodiment.

Here, first, as shown in FIG. 1, a laminated wiring having a laminated structure including a plurality of wirings is formed over a semiconductor substrate SB. Specifically, a semiconductor substrate made of a single-crystal Si (silicon) or the like is first prepared. Subsequently, a plurality of semiconductor elements including a transistor such as a MOSFET (Metal Oxide Semiconductor Field Effect Transistor), a diode, a resistor element, a capacitive element, storage elements, or the like are formed on a main surface of the semiconductor substrate SB. Among these elements, FIG. 1 shows transistors Q1 and Q2 each including source/drain regions formed in the main surface of the semiconductor substrate SB and a gate electrode formed on the main surface via a gate insulating film. The transistors Q1 and Q2 each constitute an analog circuit or a digital circuit to be described later.

Subsequently, a laminated wiring layer is formed over the semiconductor elements described above. That is, the plurality of semiconductor elements such as the transistors Q1 and Q2 are covered with an interlayer insulating film CL, and a contact plug (contact portion) penetrating the interlayer insulating film CL is formed, so that the contact plug is connected with the elements on the substrate. Subsequently, an interlayer insulating film IL1 and a wiring M1 penetrating the interlayer insulating film IL1 to be electrically connected with the contact plug are formed on the interlayer insulating film CL. The interlayer insulating film IL1 and the wiring M1 constitute a first wiring layer. Subsequently, an interlayer insulating film IL2, a wiring M2 for filling a trench in an upper surface of the interlayer insulating film IL2, and a via (contact portion) penetrating the interlayer insulating film IL2 to electrically connect the wiring M2 with the wiring M1 are formed on the interlayer insulating film IL1. The interlayer insulating film IL2, the wiring M2, and the via constitute a second wiring layer.

Subsequently, by performing the similar manufacturing process as the second wiring layer, a third wiring layer, a fourth wiring layer, and a fifth wiring layer are laminated over the second wiring layer, in this order. Note that an insulating film DP5 serving as a diffusion prevention film (cap insulating film) is formed at a bottom portion of the fifth wiring layer, and although illustration is omitted, insulating films serving as diffusion prevention films are formed also at respective bottom portions of the second to the fourth wiring layers. The diffusion prevention film is provided to prevent a metal (for example, Cu (copper)) included in each wiring from being diffused in the interlayer insulating film on the wiring. The insulating film DP5, the interlayer insulating film IL5 and a wiring WRG, and a via V5 formed in a bottom portion of the wiring WRG and penetrating the insulating film DP5 and the interlayer insulating film IL5 constitute the fifth wiring layer.

Subsequently, over the interlayer insulating film IL5 constituting the fifth wiring layer, an insulating film DP6 serving as a diffusion prevention film and an interlayer insulating film IL6 are sequentially formed. Subsequently, by use of the photolithography technique and the dry etching method, a contact hole exposing an upper surface of the wiring WRG is formed in an upper surface of the interlayer insulating film IL6. Subsequently, for example, by filling a conductor film mainly made of Al (aluminum) in the contact hole, a plug (contact portion) PG is formed in the contact hole. In this manner described above, a laminated wiring is formed.

Figure 2:
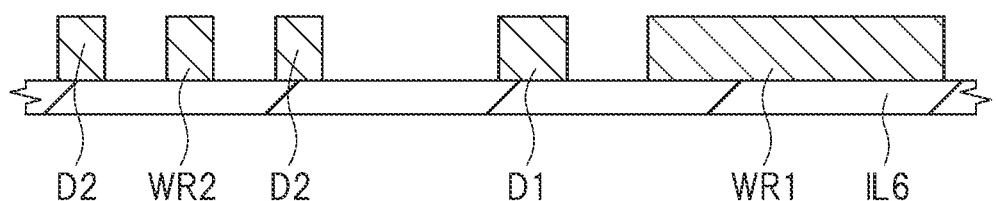
FIG. 2 is a cross-sectional view showing the method of manufacturing the semiconductor device continued from FIG. 1.

Next, as shown in FIG. 2, a first wiring WR1, a second wiring WR2, dummy wirings D1 and D2 are formed on the interlayer insulating film IL6. That is, a plurality of wiring patterns are formed on the interlayer insulating film that is located in each of a plurality of circuit formation regions to be described later. Note that, in FIG. 2 to FIG. 8, illustration of a structure below the interlayer insulating film IL6 and the plug PG is omitted. Here, for example, an aluminum film (metal film) is formed over the interlayer insulating film IL6 by sputtering, and the aluminum film is patterned by photolithography and dry etching. Accordingly, the first wiring WR1, the second wiring WR2, the dummy wirings D1 and D2 which are made of the aluminum film are formed. The dummy wiring D1 is formed to be adjacent to the first wiring WR1, and the dummy wiring D2 is formed to be adjacent to the second wiring WR2. Thus, the first wiring WR1, the second wiring WR2, the dummy wirings D1 and D2 are formed from the same aluminum film and are a film formed at the same height in a direction vertical to the main surface of the semiconductor substrate (a thickness direction or a height direction), that is, a film in the same layer. In other words, the first wiring WR1, the second wiring WR2, the dummy wirings D1 and D2 are each a wiring formed in the same layer.

The first wiring WR1, the second wiring WR2, and the dummy wirings D1 and D2 constitute a multilayer wiring layer and are each an uppermost wiring of the multilayer wiring layer. The dummy wirings D1 and D2 are pseudo wirings and do not constitute a circuit. A length of a longest side (long side) of the first wiring WR1 in plan view is longer than a length of a longest side (long side) of each of the second wiring WR2 and the dummy wirings D1 and D2 in plan view. Although illustration is not given, each of the first wiring WR1 and the second wiring WR2 has a bottom surface thereof connected to the plug PG to be electrically connected with the semiconductor elements such as the transistors Q1 and Q2, constituting a circuit. The first wiring WR1 has the bottom surface thereof connected to at least one plug PG. The second wiring WR2 has the bottom surface thereof connected to at least one plug PG. The dummy wirings D1 and D2 have the bottom surfaces thereof not connected to any plugs PG, for example.

Figure 3:
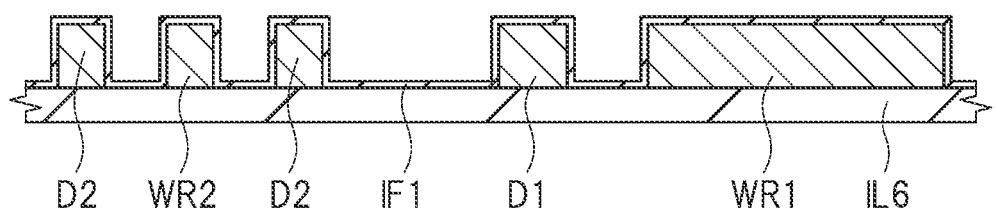
FIG. 3 is a cross-sectional view showing the method of manufacturing the semiconductor device continued from FIG. 2.

Next, as shown in FIG. 3, a thin insulating film IF1 is formed over each of the interlayer insulating film IL6, the first wiring WR1, the second wiring WR2, the dummy wirings D1 and D2. The insulating film IF1 is formed by the CVD (Chemical Vapor Deposition) method, for example, and is made of a silicon oxide film. The insulating film IF1 is a linear film made of PTEOS (Plasma Tetra Ethyl Ortho Silicate) film, for example. A film thickness of the insulating film IF1 is smaller than ½ of a shortest distance between two adjacent ones of the first wiring WR1, the second wiring WR2, and the dummy wirings D1 and D2 (hereinafter, referred to as an uppermost-layer wiring, in some cases). Accordingly, the insulating film IF1 does not fully fill a gap between the two adjacent ones of the uppermost-layer wiring.

Figure 4:
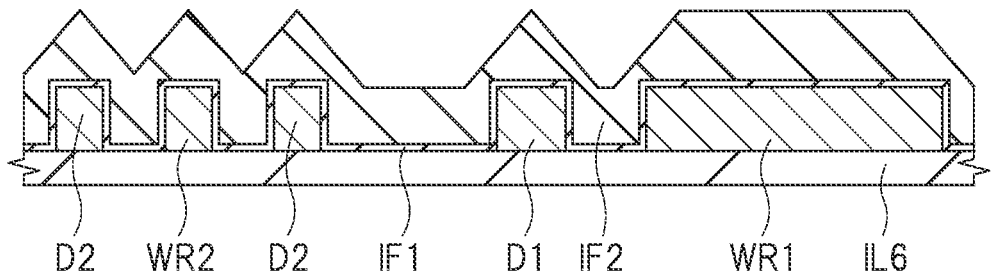
FIG. 4 is a cross-sectional view showing the method of manufacturing the semiconductor device continued from FIG. 3.

Next, as shown in FIG. 4, an insulating film IF2 is formed over the insulating film IF1. The insulating film IF2 is formed by the high-density plasma enhanced CVD method, for example, and is made of a silicon oxide film. A film thickness of a laminated film including the insulating film IF1 and the insulating film IF2 is smaller than a film thickness of the uppermost-layer wiring. Hence, a gap between adjacent ones of the uppermost-layer wiring may not be fully filled with the insulating films IF1 and IF2. That is, in the gap between adjacent ones of the uppermost-layer wirings, a position of an upper surface of the insulating film IF2 may be lower than a position of an upper surface of the uppermost-layer wiring, in some cases.

Figure 5:
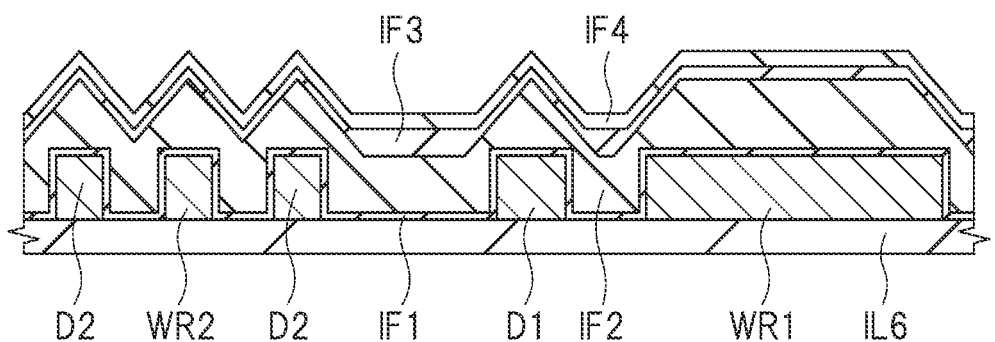
FIG. 5 is a cross-sectional view showing the method of manufacturing the semiconductor device continued from FIG. 4.

Next, as shown in FIG. 5, an insulating film IF3 is formed over the insulating film IF2. The insulating film IF3 is formed by the CVD method, for example, and is made of a silicon oxide film. The insulating film IF3 is a cap film made of a TEOS film, for example.

Subsequently, an insulating film IF4 is formed over the insulating film IF3. The insulating film IF4 is formed by the CVD method, for example. The insulating film IF4 is made of an SiN (silicon nitride) film or an SiON (silicon oxynitride) film. A laminated insulating film made of the insulating films IF1 to IF4 is referred to as a passivation film. The passivation film covers the upper surface of the interlayer insulating film IL6 and each of the first wiring WR1, the second wiring WR2, and the dummy wirings D1 and D2.

Figure 6:
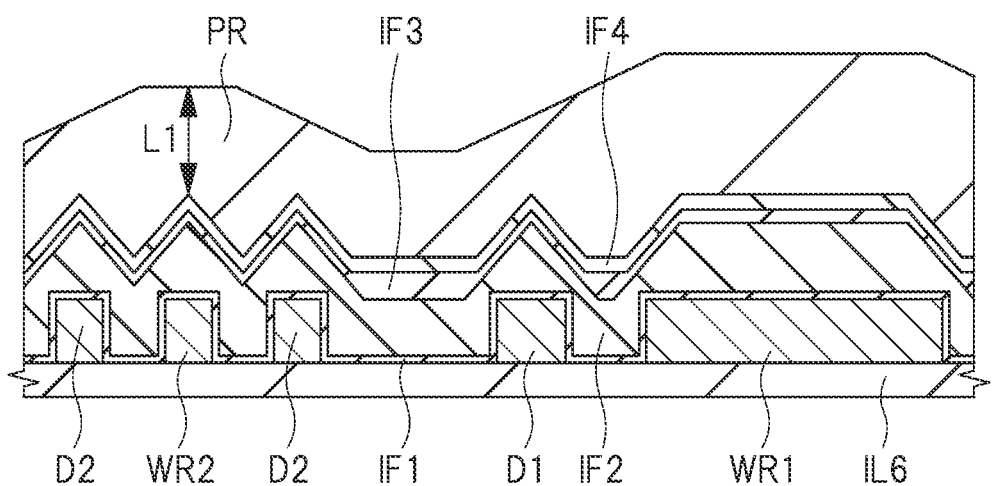
FIG. 6 is a cross-sectional view showing the method of manufacturing the semiconductor device continued from FIG. 5.

Next, as shown in FIG. 6, a photoresist film PR is coated (supplied) onto the insulating film IF4 by spin coating. The photoresist film PR is coated onto the passivation film that is located in each of the circuit formation regions to be described later. The photoresist film PR is coated so as to flow in a direction from the first wiring WR1 to the second wiring WR2. At this time, a thickness of the photoresist film PR on the first wiring WR1 having the relatively longer long side is larger than a thickness of the photoresist film PR on each of the second wiring WR2 and the dummy wirings D1 and D2 which have relatively smaller width.

Figure 7:
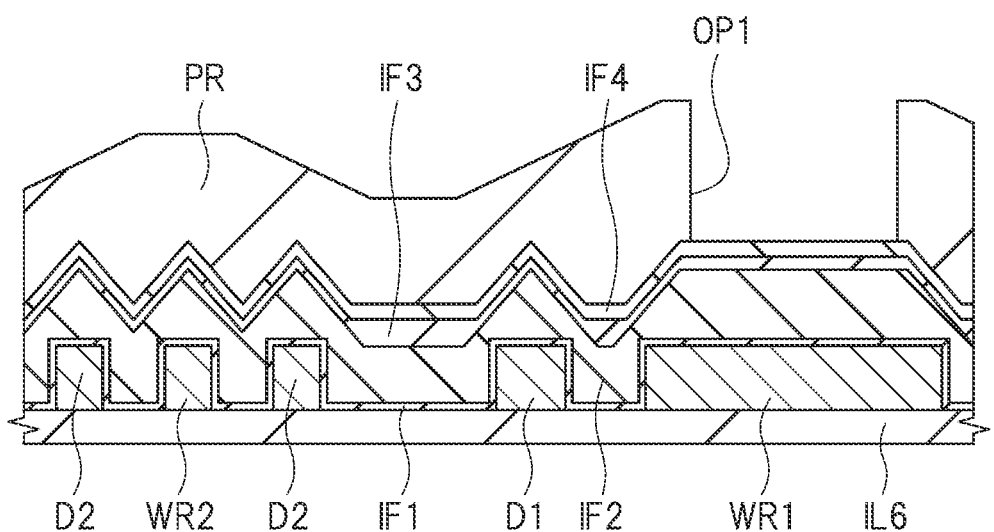
FIG. 7 is a cross-sectional view showing the method of manufacturing the semiconductor device continued from FIG. 6.

Next, as shown in FIG. 7, the photoresist film PR is subjected to exposure and development, and accordingly, part of the photoresist film PR directly above the first wiring WR1 is removed. Accordingly, formed is a resist pattern formed by the photoresist film PR including an opening portion OP1 that exposes part of the passivation film (an insulating film or a protective film) directly above the first wiring WR1. Here, each of the second wiring WR2 and the dummy wirings D1 and D2 is covered by the resist pattern.

Figure 8:
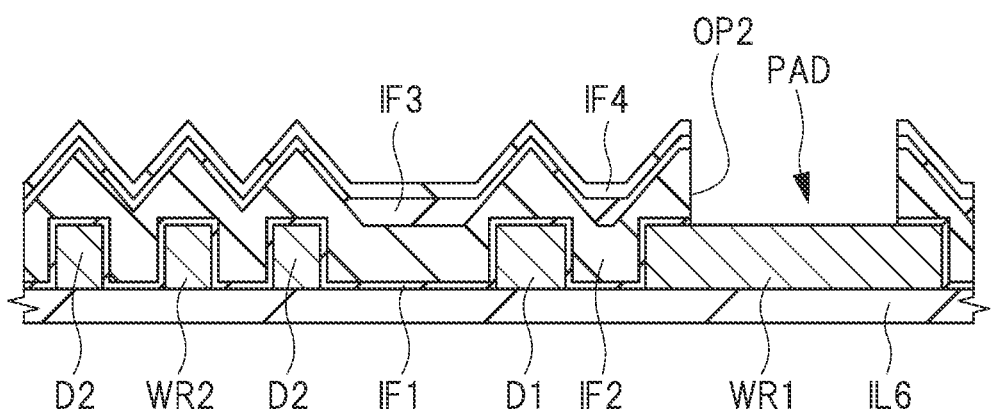
FIG. 8 is a cross-sectional view showing the method of manufacturing the semiconductor device continued from FIG. 7.

Next, as shown in FIG. 8, with the resist pattern used as an etching prevention mask, dry etching is carried out to remove part of the passivation film directly above the first wiring WR1. Hence, an opening portion OP2 penetrating the passivation film is formed, and an upper surface of the first wiring WR1 is exposed in a bottom surface of the opening portion OP2. The first wiring WR1 having the upper surface thereof exposed constitutes a pad (bonding pad) PAD that is electrically connected with a bonding wire at the upper surface thereof. In this manner described above, the semiconductor device according to the embodiment is almost completed. The semiconductor substrate (semiconductor wafer) is divided into individual pieces by dicing, and then, a plurality of semiconductor chips to be described next are obtained.

Planer Layout of Semiconductor Device

In the following, with reference to FIG. 9 to FIG. 12, a planer layout of the semiconductor device formed by the manufacturing method described above will be described. The semiconductor device according to the present embodiment is a semiconductor chip CHP (see FIG. 9 and FIG. 10).

Figure 9:
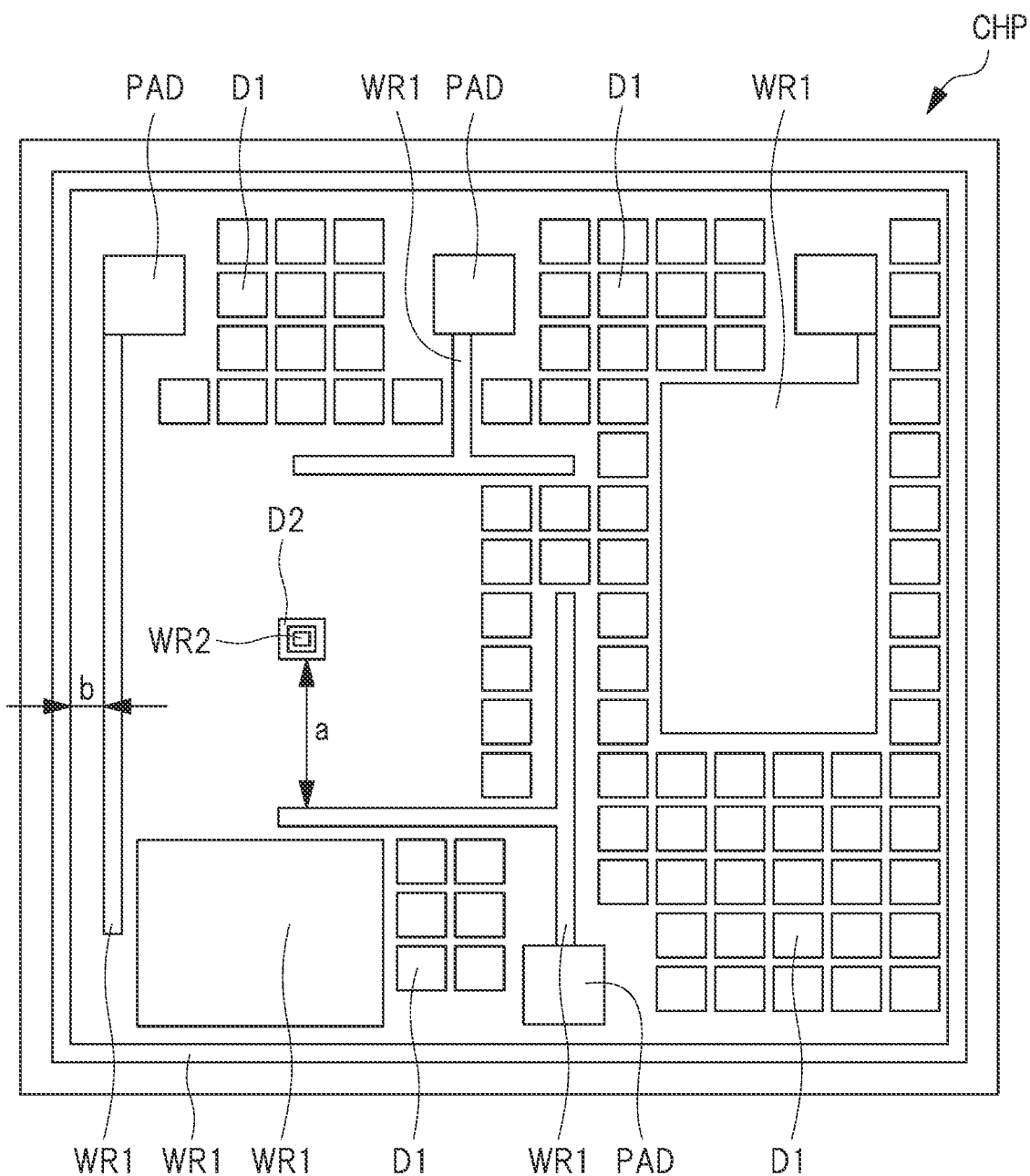
FIG. 9 is a planer layout showing the semiconductor device according to the embodiment.

As shown in FIG. 9, the first wiring WR1, the second wiring WR2, the dummy wirings D1 and D2 are apart from each other, in plan view. The length of the longest side (long side) of the first wiring WR1 in plan view is longer than the longest side (long side) of each of the second wiring WR2 and the dummy wirings D1 and D2 in plan view. In FIG. 9, a plurality of the first wirings WR1 and one second wiring WR2 are illustrated, but the second wiring WR2 may be formed in plural. Some of the first wirings WR1 constitute the pad PAD. The second wiring WR2 does not constitute the pad PAD and is not connected with the pad PAD. That is, the second wiring WR2 is apart from the pad PAD. Note that, in FIG. 9, illustration of the passivation film is omitted.

A shape of each of a plurality of dummy wirings D1 in plan view is rectangular and has a same area with each other. The plurality of the dummy wirings D1 are disposed at an equal interval in a matrix form, and densely disposed together with the first wirings WR1. That is, the dummy wirings D1 are disposed in the vicinity of the first wirings WR1. In contrast, the dummy wiring D2 is disposed around the second wiring WR2 and in the vicinity of the second wiring WR2. In other words, the dummy wiring D2 is disposed close to the second wiring WR2 in such a manner as to surround the second wiring WR2. Note that the second wiring WR2 is not necessarily required to be surrounded by the dummy wiring D2. In a group including the second wiring WR2 and the dummy wiring D2, the second wiring WR2 may be positioned on the outermost side. That is, it is sufficient if the dummy wiring D2 is disposed adjacent to the second wiring WR2.

The plurality of first wirings WR1 are disposed in such a manner as to surround the second wiring WR2 in plan view. The second wiring WR2 and the dummy wiring D2 are disposed more sparsely than the first wiring WR1 and the dummy wiring D1 and formed at positions relatively distant from the first wiring WR1 and the dummy wiring D1. That is, in plan view, a shortest distance "a" between the dummy wiring D2 and the first wiring WR1 is larger than a shortest distance "b" between adjacent ones of the first wirings WR1. Moreover, a shortest distance between the dummy wiring D2 and the dummy wiring D1 is larger than a shortest distance between adjacent ones of the dummy wirings D1. Further, the distance "a" is larger than a shortest distance between the dummy wiring D1 and the first wiring WR1 which are adjacent to each other. In addition, a shortest distance between the second wiring WR2 and the dummy wiring D2 is smaller than the distance "a."

The dummy wiring D2 is formed in an annular shape in such a manner as to surround the second wiring WR2. That is, the dummy wiring D2 encloses the second wiring WR2 therein in plan view. The dummy wiring D2 has a rectangular shape in plan view. That is, the dummy wiring D2 has an annular structure in a frame shape in plan view. A length of the longest side (long side) of the dummy wiring D2 in plan view is smaller than a length of the long side of the rectangle of the dummy wiring D1.

Figure 10:
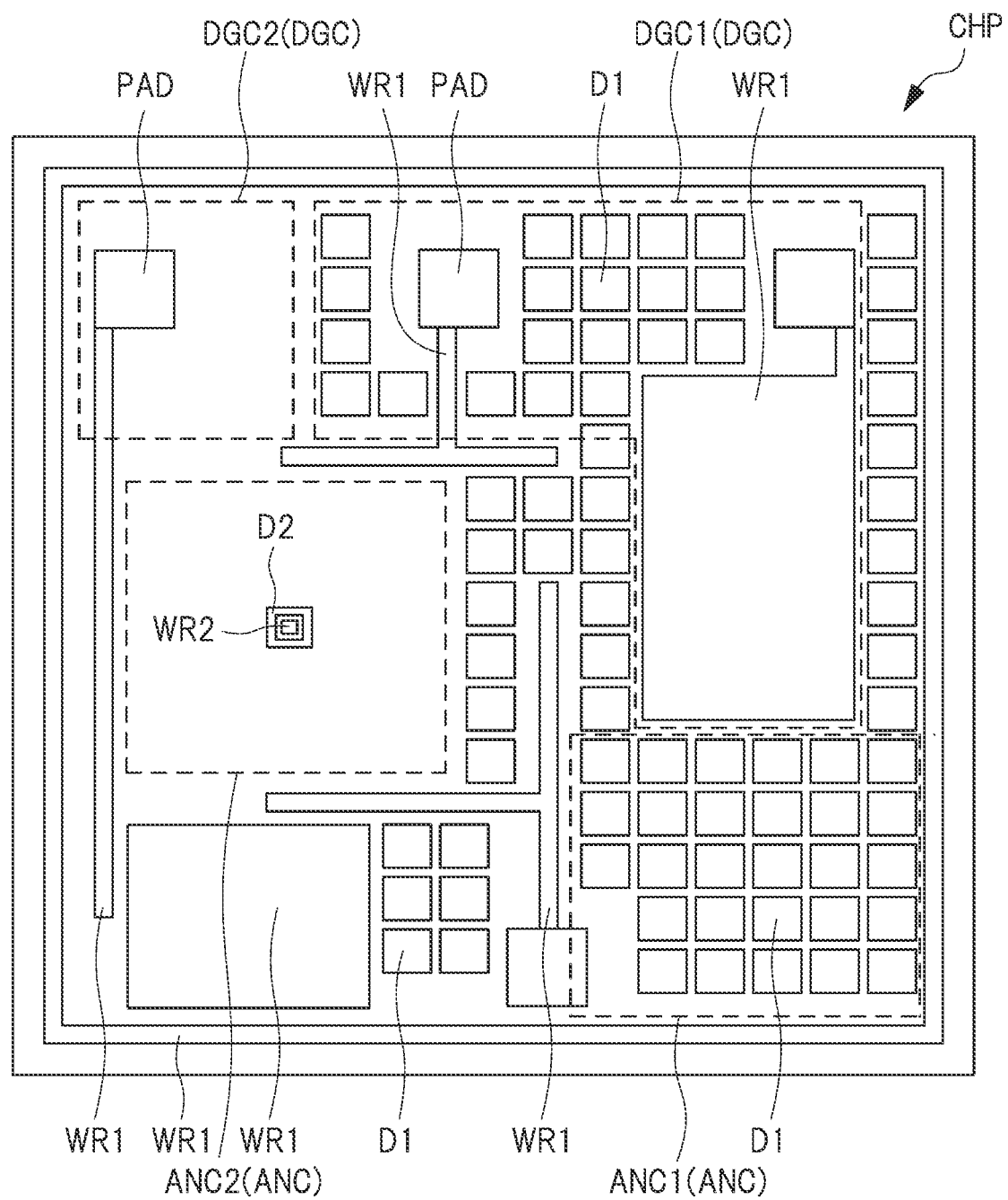
FIG. 10 is a planer layout showing the semiconductor device according to the embodiment.

The semiconductor chip CHP has a plurality of circuit formation regions. Each of the plurality of circuit formation regions has a circuit formed therein. As shown in FIG. 10, the semiconductor chip CHP has a plurality of circuit portions (digital circuit portions DGC and analog circuit portions ANC) that are arranged side by side, in plan view. In FIG. 10, a contour of each of the circuit portions is indicated with a dashed line. The semiconductor elements constituting each circuit portion are mainly formed below the multilayer wiring layer, as shown in FIG. 1.

In a first digital circuit formation region, a first digital circuit portion DGC1 is formed. The first digital circuit portion DGC1 includes a circuit for a switching regulator that includes a high side power MOSFET, and a circuit that determines an on time of the high side power MOSFET. The first digital circuit portion DGC1 includes a plurality of elements formed on the main surface of the semiconductor substrate. A plurality of wiring patterns are formed on the interlayer insulating film located in the first digital circuit formation region.

In a second digital circuit formation region, a second digital circuit portion DGC2 is formed. The second digital circuit portion DGC2 includes a driver circuit for the high side power MOSFET. The second digital circuit portion DGC2 includes a plurality of elements formed on the main surface of the semiconductor substrate. On the interlayer insulating film located in the second digital circuit formation region, a plurality of wiring patterns are formed. An operation frequency of the circuit included in the second digital circuit portion DGC2 is higher than an operation frequency of the circuit included in the first digital circuit portion DGC1. The dummy wiring pattern is not formed on the interlayer insulating film located in the second digital circuit formation region.

In a first analog circuit formation region, a first analog circuit portion ANC1 is formed. The first analog circuit portion ANC1 includes a bias circuit portion. The first analog circuit portion ANC1 includes a plurality of elements formed on the main surface of the semiconductor substrate. On the interlayer insulating film located in the first analog circuit formation region, a plurality of wiring patterns are formed.

The bias circuit portion is used as a reference power supply in an IC (Integrated Circuit) and a circuit generating a reference current and is a circuit portion which does not frequently operate.

In a second analog circuit formation region, a second analog circuit portion ANC2 is formed. The second analog circuit portion ANC2 includes an oscillator, a high voltage analog circuit portion, and an error amplifier circuit portion which are arranged side by side. The second analog circuit portion ANC2 includes a plurality of elements formed on the main surface of the semiconductor substrate. A plurality of wiring patterns are formed on the interlayer insulating film located in the second analog circuit formation region. An operation frequency of the circuit included in the second analog circuit portion ANC2 is higher than an operation frequency of the circuit included in the first analog circuit portion ANC1. Note that, although illustration is omitted, in a case in which the second analog circuit portion ANC2 is a current detecting circuit for a digital circuit, the second analog circuit portion ANC2 may be located adjacent to the second digital circuit portion DGC2, in plan view. In this case, the second analog circuit portion ANC2 is located closer to the second digital circuit portion DGC2 than each of the first digital circuit portion DGC1 and the first analog circuit portion ANC1.

The oscillator is an analog circuit portion for determining a switching frequency of a switching regulator and is a circuit portion with an operation frequency being relatively high.

The high voltage analog circuit portion is used as a current detecting circuit for the high side power MOSFET and is a circuit portion with an operation frequency being relatively high.

The error amplifier circuit portion is used as an error amplifier for controlling an output voltage of the switching regulator to be an intended voltage and is a circuit portion with an operation frequency being relatively high.

An area occupying ratio of the plurality of wiring patterns in the second digital circuit formation region is smaller than an area occupying ratio of the plurality of wiring patterns in the first digital circuit formation region. An area occupying ratio of the plurality of wiring patterns in the first analog circuit formation region is smaller than the area occupying ratio of the plurality of wiring patterns in the second digital circuit formation region. An area occupying ratio of the plurality of wiring patterns in the second analog circuit formation region is smaller than the area occupying ratio of the plurality of wiring patterns in the first analog circuit formation region. Note that the area occupying ratio is a value obtained by dividing a total area of the plurality of wiring patterns by a size of the circuit formation region. In a case in which each size of the first digital circuit formation region and the first analog circuit formation region is 40 $\mu m^2$, in plan view, the area occupying ratio of the wiring patterns in each of these regions is equal to or larger than 30%. Also, in a case in which each size of the second digital circuit formation region and the second analog circuit formation region is 70 $\mu m^2$, in plan view, the area occupying ratio of the wiring patterns of each of these regions is smaller than 1%.

Among the circuit portions described above, the first digital circuit portion DGC1 is the circuit portion where noise generation due to dense disposition of the dummy wiring directly thereabove is not particularly problematic. In addition, since the first analog circuit portion ANC1 is part of the analog circuit portion ANC but its operation is not relatively frequent, noise generation due to dense disposition of the dummy wiring directly thereabove is not particularly problematic. Accordingly, the first digital circuit portion DGC1 and the first analog circuit portion ANC1 have the dummy wiring D1 and the first wiring WR1 formed densely so as to overlap with each other in plan view.

In contrast, the second digital circuit portion DGC2 and the second analog circuit portion ANC2 with the higher operation frequency (the oscillator, the high voltage analog circuit portion, and the error amplifier circuit portion) of the analog circuit portions ANC described above are circuit portions that may cause the noise generation due to dense disposition of the dummy wirings directly thereabove. Specifically, when the dummy wirings are densely disposed on these circuit portions, a parasitic capacitance is generated between the wiring formed below the dummy wiring and the dummy wiring. This parasitic capacitance is a source of generating the noise. A circuit with a relatively higher operation frequency, for example, an error amplifier circuit portion dealing with a minute signal, or other similar circuits are liable to be affected by the noise. Accordingly, to prevent an influence caused by the noise due to the dummy wiring, the dummy wiring D1 and the first wiring WR1 that overlap with each other in plan view are not densely formed directly above such circuit portions. For example, the dummy wiring D1 and the first wiring WR1 are not densely formed even directly above any of the oscillator, the high voltage analog circuit portion, and the error amplifier circuit portion.

In addition, a MOS driver circuit portion is a digital circuit portion but operates relatively frequently and accordingly, is liable to be affected by the noise due to the dummy wiring. Hence, the dummy wiring should not be densely disposed directly above the MOS driver circuit portion. Since the analog circuit is disposed close to the MOS driver circuit portion, also to prevent noise from propagating from the MOS driver circuit portion to the second analog circuit portion ANC2, the dummy wiring should not be densely disposed directly above the MOS driver circuit portion. Moreover, since the analog circuit is formed close to the MOS driver circuit portion, to prevent noise from propagating from the second analog circuit portion ANC2 to the MOS driver circuit portion, the dummy wiring should not be densely disposed directly above the second analog circuit portion ANC2.

However, even in a region directly above such a circuit portion above that needs to prevent generation of noise, a wiring (the second wiring WR2) may be required to be formed, in some cases. In this case, to prevent generation of noise, the second wiring WR2 is formed at a smaller area and a lower density than those of the first wiring WR1.

Figure 11:
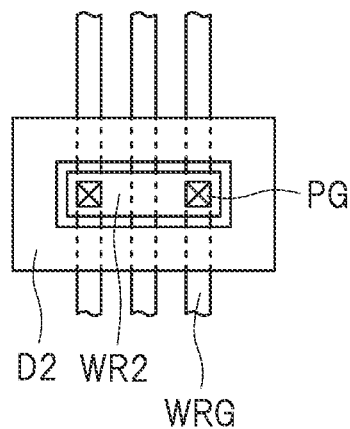
FIG. 11 is an enlarged planer layout showing the semiconductor device according to the embodiment.
Figure 12:
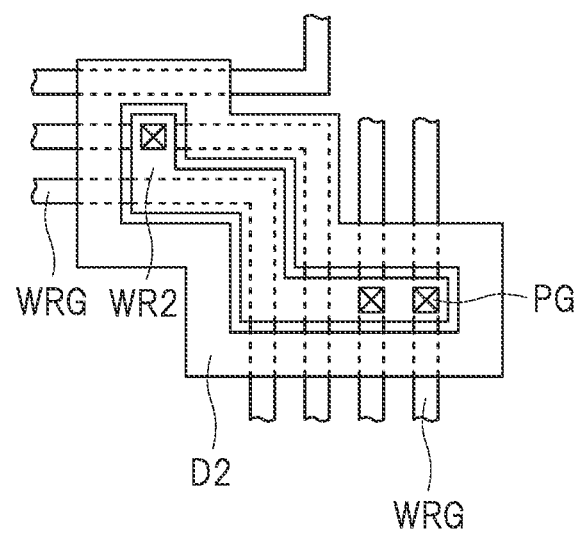
FIG. 12 is an enlarged planer layout showing the semiconductor device according to the embodiment.

FIG. 11 and FIG. 12 show the second wiring WR2 and the dummy wiring D2 in the periphery thereof in an enlarged manner. A planer shape of the second wiring WR2 may be rectangular, as shown in FIG. 11 and may have at least one or more corners as shown in FIG. 12. In FIG. 11, the second wiring WR2 extends in one direction, and in FIG. 12, the second wiring WR2 extends in an M-shaped manner. The dummy wiring D2 is continuously formed along sides of the second wiring WR2 and has a closed loop structure that surrounds the periphery of the second wiring WR2. In other words, the dummy wiring D2 has an annular pattern that continuously surrounds the second wiring WR2. In FIG. 11 and FIG. 12, indicated is the lower wiring WRG. In FIG. 11 and FIG. 12, the wiring WRG directly below each of the second wiring WR2 and dummy wiring D2 is indicated by a dashed line. The second wiring WR2 is electrically connected with the wiring WRG though the plug PG.

Figure 13:
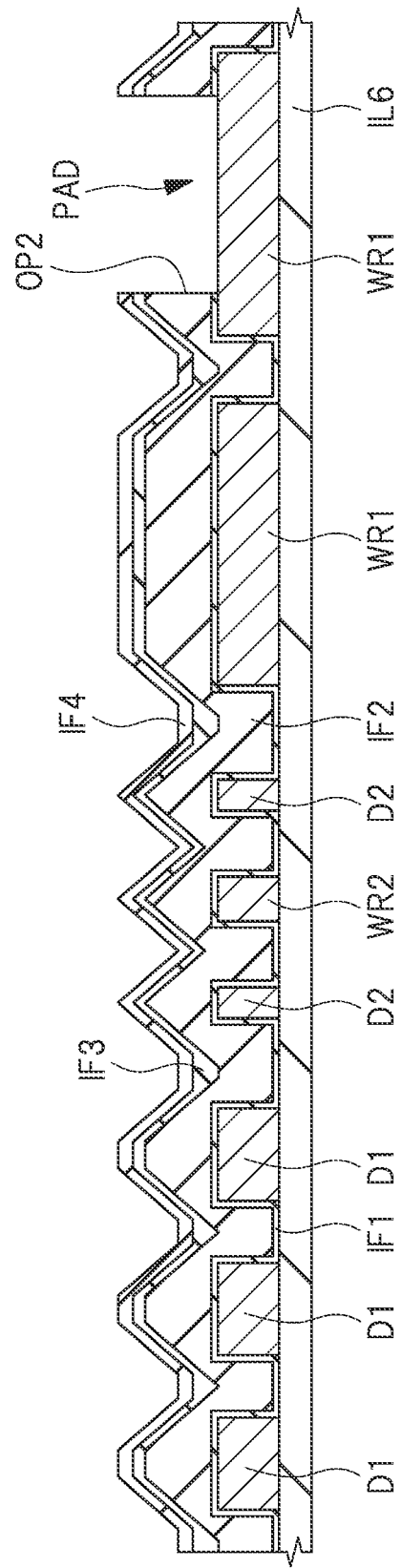
FIG. 13 is a cross-sectional view showing the semiconductor device according to the embodiment.

FIG. 13 shows a cross-sectional view of the uppermost-layer wiring of the multilayer wiring layer including the first wiring WR1, the second wiring WR2, the dummy wirings D1 and D2 that are disposed side by side. FIG. 13 indicates, in the order from the left, the dummy wiring D1, the dummy wiring D2, the second wiring WR2, and the first wiring WR1, as well as the pad PAD (the first wiring WR1). As shown in FIG. 13, each of the first wiring WR1, the second wiring WR2, the dummy wirings D1 and D2 is formed by a metal film formed with a thickness equal to each other and in contact with the flat upper surface of the interlayer insulating film IL6. That is, the first wiring WR1, the second wiring WR2, the dummy wirings D1 and D2 are each a wiring formed in the same layer.

Here, regarding a film thickness of the passivation film formed directly above each wiring of the first wiring WR1, the second wiring WR2, the dummy wirings D1 and D2, a film thickness of the passivation film directly above a center portion of each wiring of the first wiring WR1, the second wiring WR2, the dummy wirings D1 and D2 is larger than that of the passivation film directly above end portions of each wiring of the first wiring WR1, the second wiring WR2, the dummy wirings D1 and D2. That is, the passivation film is formed in a mountain-like shape directly above each of the first wiring WR1, the second wiring WR2, and the dummy wirings D1 and D2.

In addition, as shown in FIG. 13, a width of the dummy wiring D2 in the shorter direction may be smaller than a width of the second wiring WR2 in the shorter direction. That is, in plan view, a shortest width of the dummy wiring D2 in a direction orthogonal to the long side of the dummy wiring D2 may be smaller than a shortest width in a direction orthogonal to the long side of the second wiring WR2.

Effect of Present Embodiment

Figure 18:
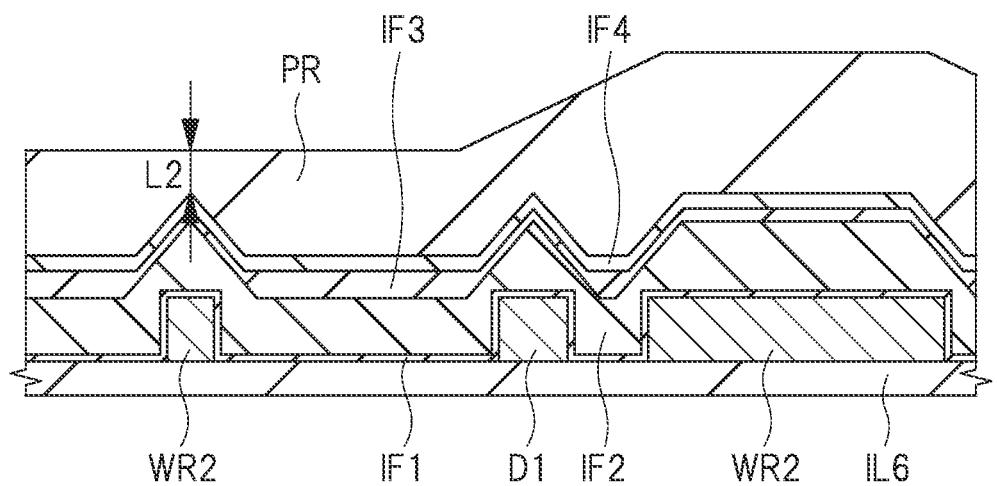
FIG. 18 is a cross-sectional view showing a method of manufacturing a semiconductor device according to a comparative example.

In a case in which the second wiring WR2 is formed at a lower density and a smaller area than those of the first wiring WR1, the following problem may occur. Specifically, when the uppermost-layer wiring and the passivation film are first formed through the manufacturing process of the semiconductor device and then the photoresist film is coated thereon by spin coating, as shown in FIG. 18 as a comparative example, a film thickness L2 of the photoresist film PR directly above the second wiring WR2 formed sparsely becomes small. That is, in coating the photoresist film PR, a resist solution is dropped by a fixed amount on the semiconductor substrate. At this time, if a region in which the first wiring WR1 and the dummy wiring D1 are disposed at high density is located upstream and a region in which the second wiring WR2 is disposed is located downstream, the former region functions as a breakwater, a supplied amount of the photoresist film PR at a flowing destination is decreased. In this manner, it is presumed that the film thickness L2 of the photoresist film PR directly above the second wiring WR2 becomes small.

Figure 19:
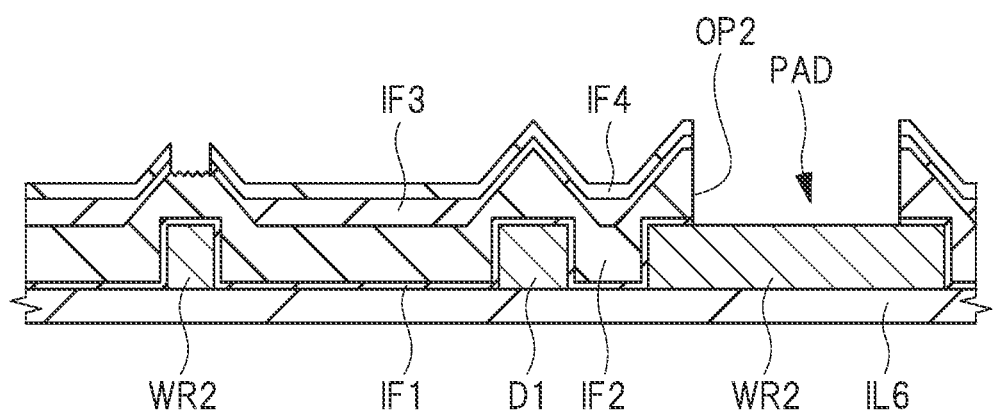
FIG. 19 is a cross-sectional view showing the method of manufacturing the semiconductor device according to the comparative example.

When the resist pattern is formed and etching for exposing the pad is performed in this state, as shown in FIG. 19 as a comparative example, the thin photoresist film PR directly above the second wiring WR2 is removed during the etching. Consequently, part of the passivation film (such as the insulating film IF4) directly above the second wiring WR2 is removed by etching. In such a semiconductor device, reliability of the passivation film is lowered, and hence, reliability of the semiconductor device is lowered. In a case in which the film thickness of the passivation film is large, a period of time required for the etching becomes longer, such a problem that the part of the passivation film directly above the second wiring WR2 as described above is removed is likely to occur.

In contrast, even in the second wiring WR2 being formed more sparsely and having a smaller area than the first wiring WR1, it is considerable that a plurality of dummy wirings D1 are disposed at a higher density in the vicinity of the second wiring WR2. However, when the dummy wiring D1 having a relatively longer length of the long side in plan view is densely disposed directly above the analog circuit portion that operates frequently, noise is generated, possibly causing an adverse effect on the circuit.

To address this problem, as shown in FIG. 7, in the present embodiment, in the vicinity of the surroundings of the wiring sparsely formed as in the second wiring WR2, the dummy wiring D2 having the long side longer than the long side of the dummy wiring D1 is locally disposed. That is, the dummy wiring D2 is locally formed in a region in which the thickness of the photoresist film PR is likely to be thin. Consequently, the passivation film is formed also directly above the dummy wiring D2, and as a result, the film thickness of the photoresist film PR in the vicinity of the second wiring WR2 can be made thick locally.

Even if such a dummy wiring D2 is formed directly above the analog circuit portion that operates frequently, the long side of the dummy wiring D2 is smaller than the long side of the dummy wiring D1, and a region in which the dummy wiring D2 is formed is local. Hence, an effect on the circuit due to the noise generation caused by formation of the dummy wiring D2 can be minimized.

To minimize a formation range of the dummy wiring D2, for example, in plan view, the number of dummy wirings D2 to be disposed from an end portion of the second wiring WR2 in a direction along a predetermined side of the second wiring WR2 to the outside is up to two. In the present embodiment shown in FIG. 11 and FIG. 12, the number of dummy wirings D2 is one. A case in which the number of dummy wirings D2 is set to two will be described below with reference to FIG. 16 and FIG. 17 in a second modification.

In the present embodiment, formation of the dummy wiring D2 as described above makes it possible to make the photoresist film PR formed above the second wiring WR2 thicker. Accordingly, in the etching step or the like for opening the passivation film, it is possible to prevent part of the passivation film directly above the second wiring WR2 from being removed. Hence, reliability of the passivation film can be enhanced. That is, an adverse effect due to noise can be prevented from being generated, and it is possible to enhance reliability of the semiconductor device, securing manufacturing facility and low costs, without increasing manufacturing steps.

Here, of the circuit portions included in the semiconductor chip, in a region directly above the circuit portion that operates frequently, the dummy wiring should not be disposed densely. Accordingly, by disposing the dummy wiring D2 in the periphery of the second wiring WR2 in such a region, it is possible to prevent lowering performance of the semiconductor device due to the generation of noise and to enhance reliability of the semiconductor device. Note that, however, even in a case in which the second wiring WR2 is sparsely formed directly above the circuit portion in which generation of noise due to dense disposition of the dummy wiring is not particularly problematic, by forming the dummy wiring D2 around the second wiring WR2, it is possible to enhance reliability of the semiconductor device as in the above description. That is, the second wiring WR2 and the dummy wiring D2 of the present embodiment may be formed directly above not only the circuit portion that relatively operates frequently, but also the circuit portion that does not relatively operate frequently. The circuit portion that relatively operates frequently includes, for example, the driver circuit of the high side power MOSFET, the oscillator, the high voltage analog circuit portion, or the error amplifier circuit portion. Also, the circuit portion that does not relatively operate frequently includes, for example, the circuit portion formed by the high side power MOSFET or the bias circuit portion. The circuit portion that operates frequently in the present application represents, for example, the circuit portion that operates more frequently than the bias circuit portion.

First Modification

Figure 14:
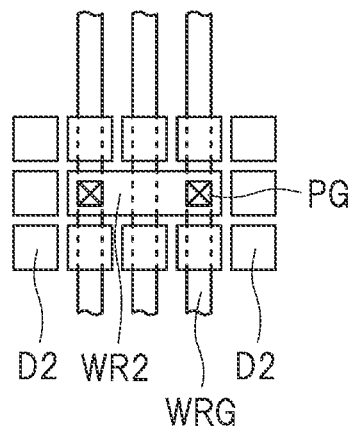
FIG. 14 is an enlarged planer layout showing a semiconductor device according to a first modification of the embodiment.
Figure 15:
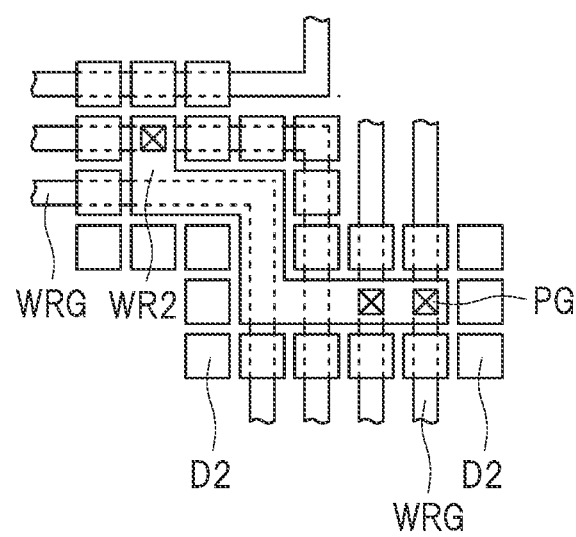
FIG. 15 is an enlarged planer layout showing the semiconductor device according to the first modification of the embodiment.

As shown in FIG. 14 and FIG. 15, the dummy wiring D2 around the second wiring WR2 may be arranged discretely along the sides of the second wiring WR2 and disposed in plural. Here, each of the plurality of dummy wirings D2 has a rectangular shape in plan view. By arranging such dummy wirings D2 at equal intervals along the sides of the second wiring WR2, the dummy wirings D2 surround the second wiring WR2. That is, the dummy wirings D2 that surround the periphery of the second wiring WR2 in the vicinity of the second wiring WR2 may be formed discontinuously.

Here, in plan view, the number of dummy wirings D2 to be disposed from the end portions of the second wiring WR2 along a predetermined side of the second wiring WR2 to the outside is one.

Second Modification

Figure 16:
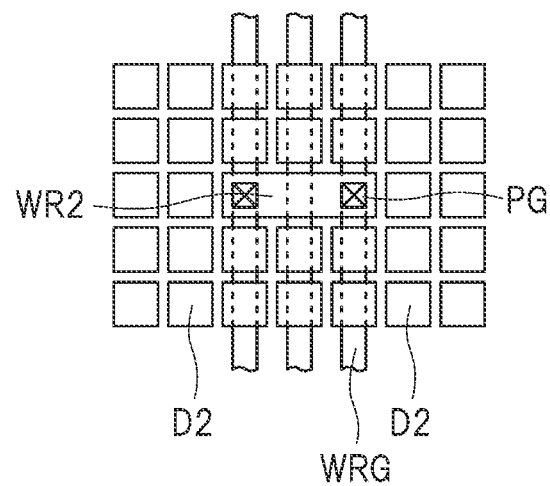
FIG. 16 is an enlarged planer layout showing a semiconductor device according to a second modification of the embodiment.
Figure 17:
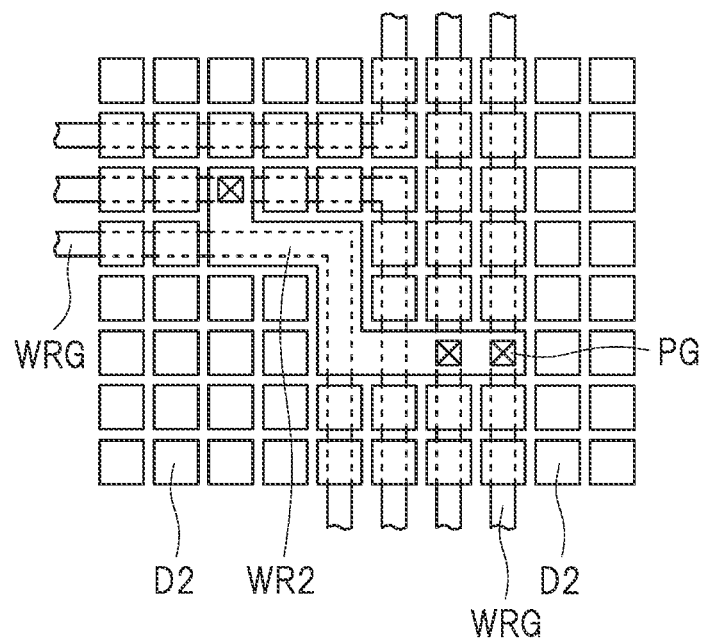
FIG. 17 is an enlarged planer layout showing the semiconductor device according to the second modification of the embodiment.

As shown in FIG. 16 and FIG. 17, the dummy wirings D2 may be doubly disposed around the second wiring WR2. Here, the dummy wirings D2 are discretely arranged as in the first modification to surround the second wiring WR2. Here, in addition to the inner dummy wirings D2 that surround the second wiring WR2 at a position closer to the second wiring WR2, the outer dummy wirings D2 that surround the periphery of the inner dummy wirings D2 in plan view may be provided.

Here, in plan view, the number of dummy wirings D2 to be disposed from the end portions of the second wiring WR2 along a predetermined side of the second wiring WR2 to the outside is two. The dummy wirings D2 around the second wiring WR2 are arranged in a matrix form in plan view, including the inner dummy wirings D2 and the outer dummy wirings D2.

In the present modification, a case in which the dummy wirings D2 that surround the periphery of the second wiring WR2 are discontinuously formed has been described. In contrast to this modification, as in FIG. 11 and FIG. 12, both or either one of the inner dummy wirings D2 and the outer dummy wirings D2 may have an annular structure and surround the second wiring WR2 in the pattern formed continuously.

In the foregoing, the invention made by the inventors of the present invention has been concretely described based on the embodiments. However, it is needless to say that the present invention is not limited to the foregoing embodiments and various modifications and alterations can be made within the scope of the present invention.

What is claimed is:

1. A method of manufacturing a semiconductor device, comprising:
   (a) sequentially forming a plurality of elements and an interlayer insulating film on a substrate;
   (b) forming a plurality of first wirings, a second wiring, a plurality of first dummy wirings, and a second dummy wiring on the interlayer insulating film;
   (c) forming an insulating film that covers each of an upper surface of the interlayer insulating film, the plurality of first wirings, the second wiring, the plurality of first dummy wirings, and the second dummy wiring;
   (d) coating a photoresist film on the insulating film by spin coating;
   (e) forming a resist pattern formed by the photoresist film; and
   (f) performing etching with the resist pattern used as a mask to remove part of the insulating film, and exposing an upper surface of part of the plurality of first wirings,
   wherein the plurality of first wirings are disposed to surround the second wiring in plan view, wherein the plurality of first dummy wirings are disposed in a vicinity of each of the plurality of first wirings, wherein some of the plurality of elements constitute an analog circuit portion, wherein the second wiring and the second dummy wiring are disposed at such a position as to overlap with the analog circuit portion in plan view, wherein the second dummy wiring is disposed around the second wiring in a vicinity of the second wiring, wherein a shortest distance between the second dummy wiring and the plurality of first wirings is larger than a shortest distance between adjacent ones of the first wirings, and wherein, in the (c), regarding a film thickness of the insulating film formed directly above each of the plurality of first wirings, the second wiring, the plurality of first dummy wirings, and the second dummy wiring, a film thickness of the insulating film formed directly above a center portion of each of the plurality of first wirings, the second wiring, the plurality of first dummy wirings, and the second dummy wiring is larger than a film thickness of the insulating film formed directly above both end portions of each of the plurality of first wirings, the second wiring, the plurality of first dummy wirings, and the second dummy wiring.

2. The method according to claim 1,
wherein some of the plurality of elements constitute a bias circuit portion,
wherein the analog circuit portion has a first circuit portion, and
wherein the first circuit portion operates more frequently than the bias circuit portion.

3. The method according to claim 2,
wherein the first circuit portion is an oscillator, a high voltage analog circuit portion, or an error amplifier circuit portion.

4. The method according to claim 1,
wherein a shortest distance between the second dummy wiring and the plurality of first dummy wirings is larger than the shortest distance between adjacent ones of the first dummy wirings.

5. The method according to claim 1,
wherein the upper surface of the first wiring being exposed in the (f) and the second wiring are spaced apart from each other.

6. The method according to claim 1,
wherein the plurality of first wirings, the second wiring, the plurality of first dummy wiring, and the second dummy wiring are each formed in a same layer.

7. The method according to claim 1,
wherein a length of a longest side of the second dummy wiring is shorter than a length of a longest side of the first dummy wiring, in plan view.

8. The method according to claim 1,
wherein, in the (a), a laminated wiring including a plurality of wirings is formed in the interlayer insulating film,
wherein the laminated wiring, the plurality of first wirings, the second wiring, the plurality of first dummy wirings, and the second dummy wiring constitute a multilayer wiring layer, and
wherein the plurality of first wirings, the second wiring, the plurality of first dummy wirings, and the second dummy wiring constitute an uppermost wiring layer of the multilayer wiring layer.

9. The method according to claim 1,
wherein the second dummy wiring has an annular pattern that continuously surrounds a periphery of the second wiring, in plan view.

10. The method according to claim 1,
wherein the second dummy wiring is formed in plural, and
wherein a plurality of the second dummy wirings discretely surround a periphery of the second wiring, in plan view.

11. The method according to claim 1,
wherein the second dummy wiring is formed in plural, and
wherein some of the second dummy wirings are formed in such a manner as to surround the second dummy wiring, in plan view.

12. A method of manufacturing a semiconductor device, comprising:
(a) preparing a semiconductor substrate including a main surface, a plurality of first elements formed on the main surface, a plurality of second elements formed on the main surface, a plurality of third elements formed on the main surface, and an interlayer insulating film formed on the main surface so as to cover the plurality of first elements, the plurality of second elements, and the plurality of third elements,
the semiconductor substrate including
a first circuit formation region in which a first circuit including the plurality of first elements is formed,
a second circuit formation region in which a second circuit including the plurality of second elements is formed, and
a third circuit formation region in which a third circuit including the plurality of third elements is formed;
(b) forming a plurality of first wiring patterns on the interlayer insulating film that is located in the first circuit formation region, a plurality of second wiring patterns on the interlayer insulating film that is located in the second circuit formation region, and a plurality of third wiring patterns on the interlayer insulating film that is located in the third circuit formation region, after the (a);
(c) forming an insulating film over the interlayer insulating film so as to cover the plurality of first wiring patterns, the plurality of second wiring patterns, and the plurality of third wiring patterns, after the (b);
(d) coating a photoresist film over the insulating film that is located in each of the first circuit formation region, the second circuit formation region, and the third circuit formation region, by spin coating, after the (c); and
(e) performing etching process with the photoresist film used as a mask, after the (d), and forming a first opening portion in the insulating film, to expose part of the plurality of first wirings in the first opening portion,
wherein an area occupying ratio of the plurality of second wiring patterns in the second circuit formation region is smaller than an area occupying ratio of the plurality of first wiring patterns in the first circuit formation region,
wherein an area occupying ratio of the plurality of third wiring patterns in the third circuit formation region is smaller than an area occupying ratio of the plurality of second wiring patterns in the second circuit formation region,
wherein the first circuit is a digital circuit,
wherein the second circuit and the third circuit are each an analog circuit, wherein an operation frequency of the third circuit is higher than an operation frequency of the second circuit, and wherein a plurality of dummy wiring patterns are further formed adjacent to the plurality of third wiring patterns on the interlayer insulating film that is located in the third circuit formation region, in the (b).

13. The method according to claim 12, wherein the semiconductor substrate includes a plurality of fourth elements formed on the main surface, and has a fourth circuit formation region in which a fourth circuit including the plurality of fourth elements is formed, wherein the interlayer insulating film is formed over the main surface so as to cover the plurality of fourth elements, wherein, in the (b), a plurality of fourth wiring patterns are formed on the interlayer insulating film that is located in the fourth circuit formation region, wherein, in the (c), the insulating film is formed over the interlayer insulating film so as to cover the plurality of fourth wiring patterns, wherein, in the (d), the photoresist film is coated onto the insulating film that is located in the fourth circuit formation region, wherein the fourth circuit is a digital circuit, wherein an area occupying ratio of the plurality of fourth wiring patterns in the fourth circuit formation region is smaller than an area occupying ratio of the plurality of first wiring patterns in the first circuit formation region, and wherein an operation frequency of the fourth circuit is higher than an operation frequency of the first circuit.

14. The method according to claim 13, wherein the third circuit formation region is located adjacent to the fourth circuit formation region, in plan view, wherein the third circuit formation region is located closer to the fourth circuit formation region than each of the first circuit formation region and the second circuit formation region, in plan view, and wherein a dummy wiring pattern is not formed on the interlayer insulating film that is located in the fourth circuit formation region.

* * * * *